United States Patent [19]
Sze

[11] Patent Number: 6,060,367
[45] Date of Patent: May 9, 2000

[54] METHOD OF FORMING CAPACITORS

[75] Inventor: Jhy-Jyi Sze, Tainan, Taiwan

[73] Assignee: United Semiconductor Circuit Corp., Taiwan

[21] Appl. No.: 09/059,686

[22] Filed: Apr. 14, 1998

[51] Int. Cl.⁷ .................................................. H01L 21/20
[52] U.S. Cl. ........................ 438/398; 438/254; 438/255
[58] Field of Search .................................... 438/239, 244,
438/250, 253, 254, 255, 396, 397, 398

[56] References Cited

U.S. PATENT DOCUMENTS

| | | | |
|---|---|---|---|
| 5,858,834 | 1/1999 | Hirota et al. | 438/253 |
| 5,858,837 | 1/1999 | Sakoh et al. | 438/255 |
| 5,902,124 | 5/1999 | Hong | 438/255 |

Primary Examiner—Charles Bowers
Assistant Examiner—Jack Chen

[57] ABSTRACT

The method for forming a first electrodes of capacitors on a semiconductor substrate includes the steps as follows. At first, a first dielectric layer is formed. A portion of the first dielectric layer is then removed to define contact holes. A first conductive layer is formed within the contact holes and over the first dielectric layer. A second dielectric layer is formed over the first conductive layer. A portion of the second dielectric layer is removed to define the shape of the first electrodes. A second conductive layer is formed over the second dielectric layer and the first conductive layer. A first rugged silicon layer is formed over the second conductive layer. A third dielectric layer is then formed over the first rugged silicon layer. A portion of the third dielectric layer, of the first rugged silicon layer, and of the second conductive layer is removed to define capacitor area. The second dielectric layer is removed and a second rugged silicon layer is formed over the substrate. A portion of the second rugged silicon layer and a portion of the first conductive layer which are located outside the capacitor area is removed. Finally, the third dielectric layer is removed to form the first electrodes.

11 Claims, 7 Drawing Sheets

METHOD OF FORMING CAPACITORS

FIELD OF THE INVENTION

The present invention relates to a semiconductor manufacturing process, and more specifically, to a method of forming capacitors. An etching back process for the fabrication of inverse-π shape or cylinder capacitors is proposed in the invention.

BACKGROUND OF THE INVENTION

Continuous research and development in the IC (integrated circuits) industry has led the fabrication technology of semiconductor chips into the ULSI (ultra large scale integration) stage. The integrity or packing density of the semiconductor devices increases at an exponential rate. A single chip may contain millions or even hundreds of millions of devices. The size of the devices on the semiconductor substrate has become smaller and smaller for packing into a chip with a high density.

For example, the capacity of a single DRAM (dynamic random access memory) chip has increased from 16 megabit and 64 megabit to 256 megabit or even larger capacity. The size of devices such as transistors, connections, and capacitors have to be narrowed for several times to realize the increased capacity within almost the same chip size. The major challenge is to manufacture every element in a much smaller size without degradation in functionality.

Capacitors are vital elements in lots of applications like DRAM, memory arrays, logic circuits, and analog circuits. The structure of a capacitor is formed by sandwiching two conductive layers with a dielectric layer in-between. The ability of a capacitor to hold electric charge, namely the capacitance, is proportional to the surface area of the conductive layers. In a densely packed chip, the capacitor must maintain the capacitance with reduced size, or the operational characteristics of the memory cell or the circuits can be damaged. Under the challenge, many methods and technologies were proposed to fabricate capacitors in smaller size without reduced capacitance. The technology of a rugged silicon film or hemi-spherical grain (HSG) polysilicon film is widely employed for its large effective surface area within limited region.

A polysilicon layer is formed to have a rugged surface or a surface fill of hemi-spherical grain to increase the surface area significantly. In general, the HSG silicon film is formed on a conductive layer like doped polysilicon to serve as first electrodes of capacitors. An etching-back step must be performed to define the individual electrodes on the substrate. However, the HSG silicon film can be easily damaged by the etching-back step to the widely distributed small grains. The electrical characteristics, the shape, and the surface area of the film can be greatly influenced by the etching-back induced damage. Thus a capacitor with a damaged electrode surface can suffer from problems of decreased capacitance and dielectric layer leakage. The reliability and functional characteristics of the device and the circuit can be spoiled.

What is needed is a method for forming HSG films which are free of etching-back induced damage, in order to increase the capacitance of the capacitors and reliability of the devices.

SUMMARY OF THE INVENTION

A method of forming first electrodes of capacitors is disclosed in the invention. The process to finish the capacitors is also proposed. A damage-free rugged silicon film or HSG silicon film can be formed. The dielectric layer leakage problem can be solved. The capacitors like inverse-i shape or cylinder capacitors can be formed.

The method is provided for forming a first electrodes of capacitors on a semiconductor substrate. The method comprising the steps of: forming a first dielectric layer; removing a portion of the first dielectric layer to define contact holes within; forming a first conductive layer within the contact holes and over the first dielectric layer; forming a second dielectric layer over the first conductive layer; removing a portion of the second dielectric layer to define shape of the first electrodes; forming a second conductive layer over the second dielectric layer and the first conductive layer; forming a first rugged silicon layer over the second conductive layer; forming a third dielectric layer over the first rugged silicon layer; removing a portion of the third dielectric layer, of the first rugged silicon layer, and of the second conductive layer to define capacitor area; removing the second dielectric layer; forming a second rugged silicon layer over the substrate; removing a portion of the second rugged silicon layer and a portion of the first conductive layer which are located outside the capacitor area; and removing the third dielectric layer to form the first electrodes.

The method for forming a first electrodes of capacitors on a semiconductor substrate in the second embodiment of the present invention can include the steps of: forming a first dielectric layer; removing a portion of the first dielectric layer to define contact holes within; forming a first conductive layer within the contact holes and over the first dielectric layer; forming a second dielectric layer over the first conductive layer; removing a portion of the second dielectric layer and of the first conductive layer to define capacitor area; forming a second conductive layer over the substrate; removing a portion of the second conductive layer to form a sidewall conductive structure on the second dielectric layer and the first conductive layer; removing the second dielectric layer; forming a rugged silicon layer over the substrate; and removing a portion of the rugged silicon layer located on the first dielectric layer to form the first electrodes.

BRIEF DESCRIPTION OF THE INVENTION

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

A method of forming first electrodes of capacitors and fabricating capacitors is disclosed in the invention. By the two-step rugged silicon film or HSG silicon film deposition and etching-back process, damage-free first electrodes can be formed. A third dielectric layer covering over a first rugged silicon layer is formed. The first rugged silicon layer can be protected from etching-induced damage. The third dielectric layer serves also as a mask in the etching process. With the defect-free electrodes, the dielectric layer leakage problem of the conventional method can be solved. The capacitors like inverse-π shape or cylinder capacitors can be formed.

Figure 1:
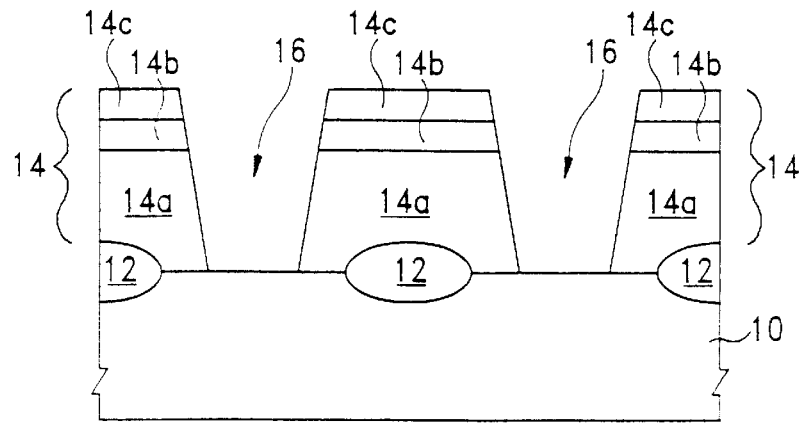
FIG. 1 is a cross sectional view of forming a first dielectric layer and defining contact holes in accordance with the present invention.

Referring to FIG. 1, a semiconductor substrate 10 is illustrated. In most process of forming capacitors, the substrate 10 is provided with the circuit devices already formed over. The elements like isolation regions 12 and transistors are formed over the substrate 10. The transistors are not illustrated in the cross section for a focused illustration on the method of forming capacitors in the present invention.

At first, a first dielectric layer 14 is formed as shown in FIG. 1. The dielectric layer 14 are formed to insulate individual devices for forming contacts within. In the preferred embodiment, the first dielectric layer 14 can include three dielectric layers. The first layer can be an oxide layer 14a to act as an interpolysilicon dielectric (IPD). The second layer is a nitride layer 14b forming over the oxide layer 14a. The third layer is another oxide layer 14c forming over the nitride layer 14b.

A portion of the first dielectric layer 14 is then removed to define contact holes 16 within. The contact holes 16 can be defined and formed by a pattering process. A photoresist layer is formed over the first dielectric layer 14. The photoresist layer is defined with the pattern of contact holes 16 by lithography. After the photoresist layer is exposed and developed, an etching step is performed by using the photoresist layer as a mask to form the contact holes 16. An anisotropic etching process like a reactive ion etching (RIE) process can be employed.

Figure 2:
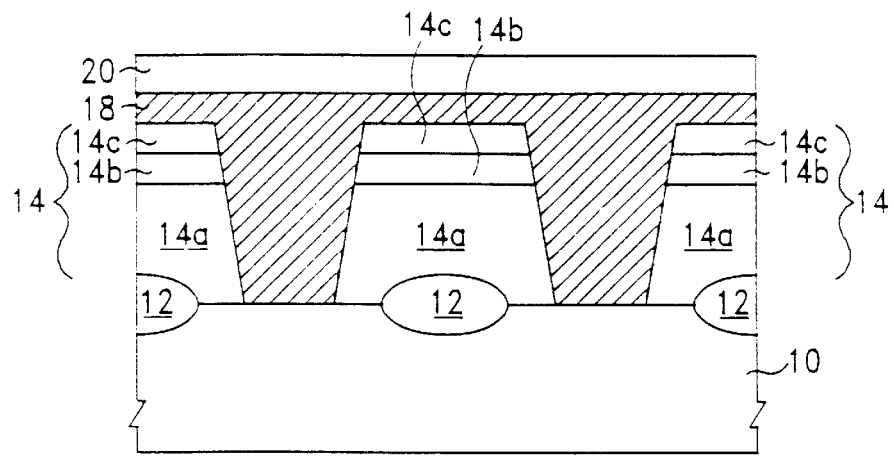
FIG. 2 is a cross sectional view of forming a first conductive layer and a second dielectric layer in accordance with the present invention.

Turning to FIG. 2, a first conductive layer 18 is formed within the contact holes 16 and over the first dielectric layer 14. In general, a polysilicon layer is used as the first conductive layer 18. The polysilicon layer can be formed by chemical vapor deposition and can be in-situ doped or implanted to increase the conductivity. A second dielectric layer 20 is then formed over the first conductive layer 18. In the case, a BPSG (borophosphosilicate) layer is deposited as the second dielectric layer 20.

Figure 3:
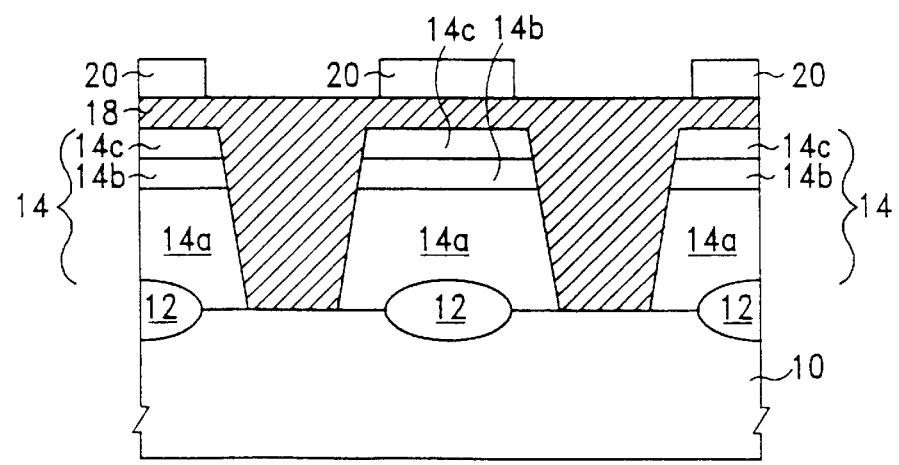
FIG. 3 is a cross sectional view of removing a portion of the second dielectric layer to define the shape of the first electrodes in accordance with the present invention.

Next, a portion of the second dielectric layer 20 is removed to define the shape of the first electrodes of the capacitors, as shown in FIG. 3. For example, the second dielectric layer 20 located approximately above the contact holes 16 are removed to define the desired electrode pattern. A patterning process including the lithography process and an etching step can be performed to remove the portion of the second dielectric layer 20. The process well known in the art is similar with the definition of contact holes 16 and thus is not described in detail.

Figure 4:
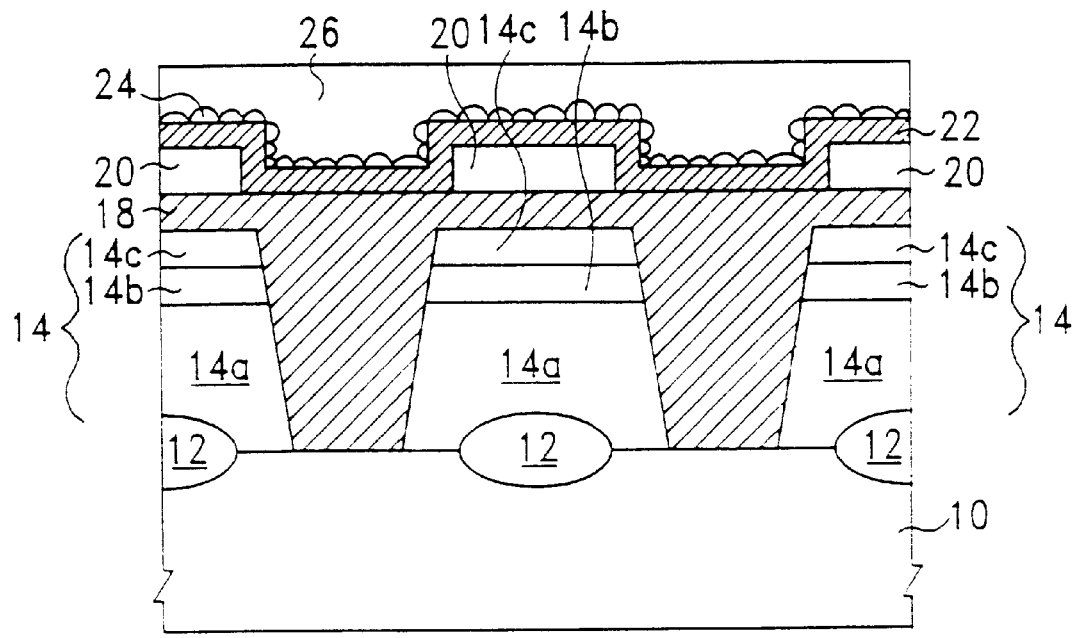
FIG. 4 is a cross sectional view of forming a second conductive layer, a first rugged silicon layer, and a third dielectric layer in accordance with the present invention.

Referring to FIG. 4, a second conductive layer 22 is then formed over the second dielectric layer 20 and the first conductive layer 18. By removing a portion of the second dielectric layer 20 in the previous step, the profile of the second conductive layer 22 can be established. In the preferred embodiment, a polysilicon layer is used as the second conductive layer 22. The polysilicon layer can be formed by chemical vapor deposition and can be in-situ doped or implanted to increase the conductivity, as well as the first conductive layer 18.

A first rugged silicon layer 24 is formed over the second conductive layer 22, as shown in FIG. 4. The first rugged silicon layer 24 can be a silicon layer with a rugged surface to increase the surface area. A HSG (hemi-spherical grain) polysilicon film is used in the case. A third dielectric layer 26 is then formed over the first rugged silicon layer 24. The third dielectric layer 26 serves as a protective layer for the first rugged silicon layer 24 in a later etching step. The third dielectric layer 26 can be selected from the materials having a good etching selectivity against the BPSG layer 20. An oxide layer formed with plasma-enhanced chemical vapor deposition (PECVD) is employed as the third dielectric layer 26.

Figure 5:
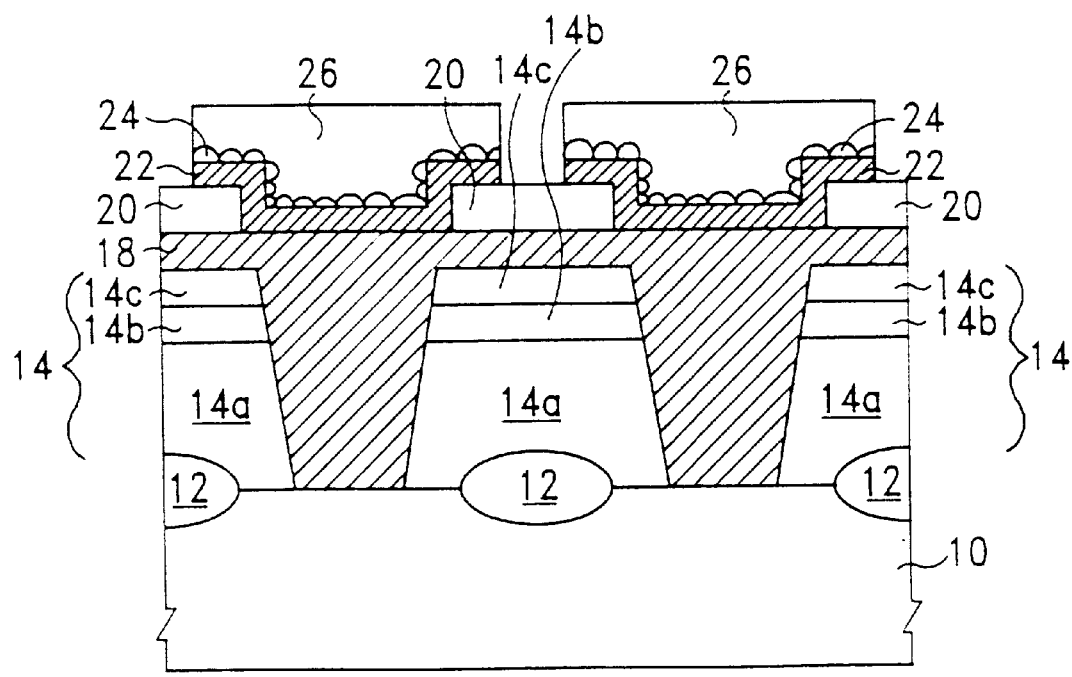
FIG. 5 is a cross sectional view of removing a portion of the third dielectric layer, of the first rugged silicon layer, and of the second conductive layer to define capacitor area in accordance with the present invention.

Turning to FIG. 5, a portion of the third dielectric layer 26, of the first rugged silicon layer 24, and of the second conductive layer 22 is removed to define the capacitor area. A patterning process including a lithography and one or two etching steps can be employed. The third dielectric layer 26, the first rugged silicon layer 24, and the second conductive layer 22 on the defined region between the capacitors are removed down to the second dielectric layer 20, which is an etching stop in the process.

Figure 6:
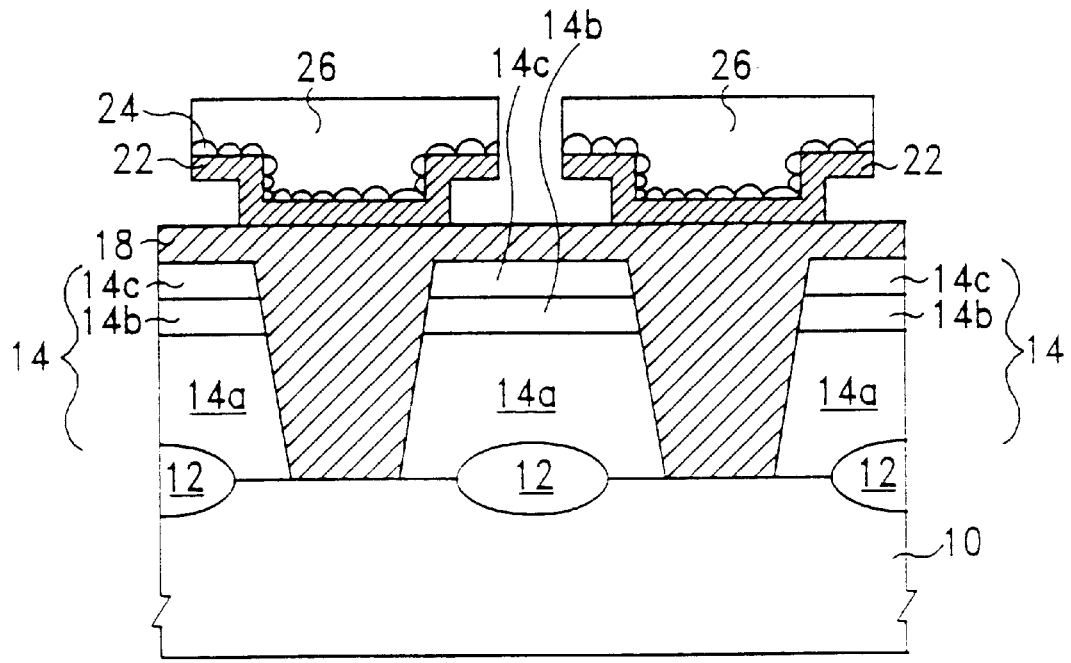
FIG. 6 is a cross sectional view of removing the second dielectric layer in accordance with the present invention.

Next, the second dielectric layer 20 is removed, as shown in FIG. 6. The removing can be performed with a vapor phase etching with HF (Hydrofluoric Acid). Since the third dielectric layer 26 is selected with a good etching selectivity against the BPSG layer 20, the BPSG layer 20 can be etched off without damaging much of the third dielectric layer 26.

Figure 7:
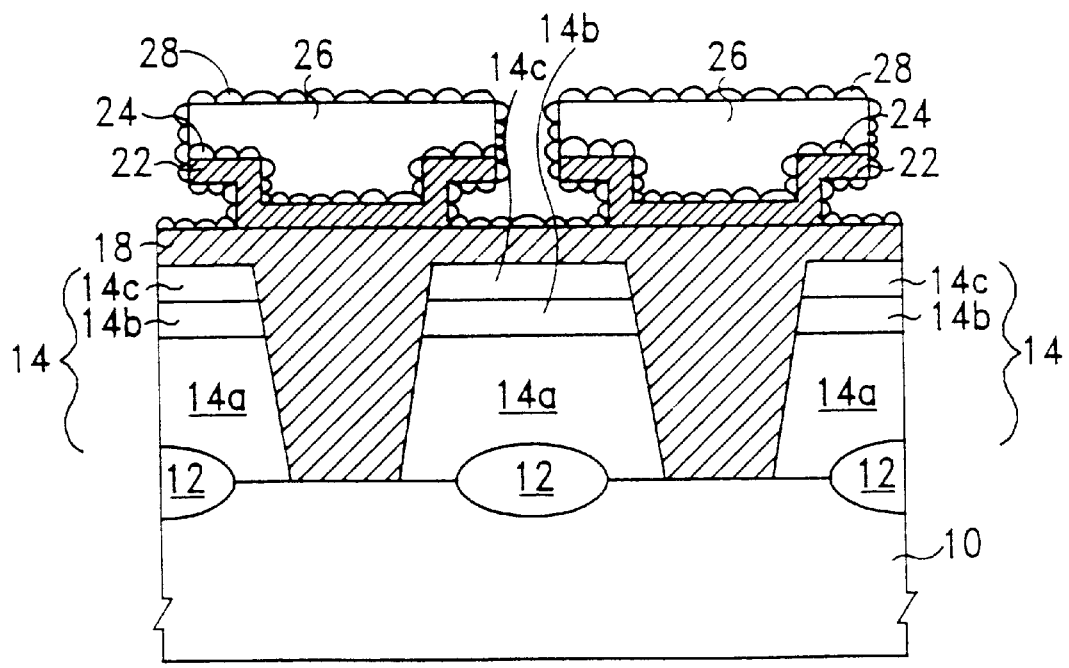
FIG. 7 is a cross sectional view of forming a second rugged silicon layer over the substrate in accordance with the present invention.

Referring to FIG. 7, a second rugged silicon layer 28 is then formed over the substrate 10. The second rugged silicon layer 28 is formed on the exposed surface of the third dielectric layer 26, of the second conductive layer 22, and of the first conductive layer 18. The second rugged silicon layer 28 can be a HSG silicon or polysilicon film as well as the first rugged silicon layer 24. The bottom surface of the second conductive layer 22 can be formed also with the HSG film 28 to increase the area of the first electrodes.

Figure 8:
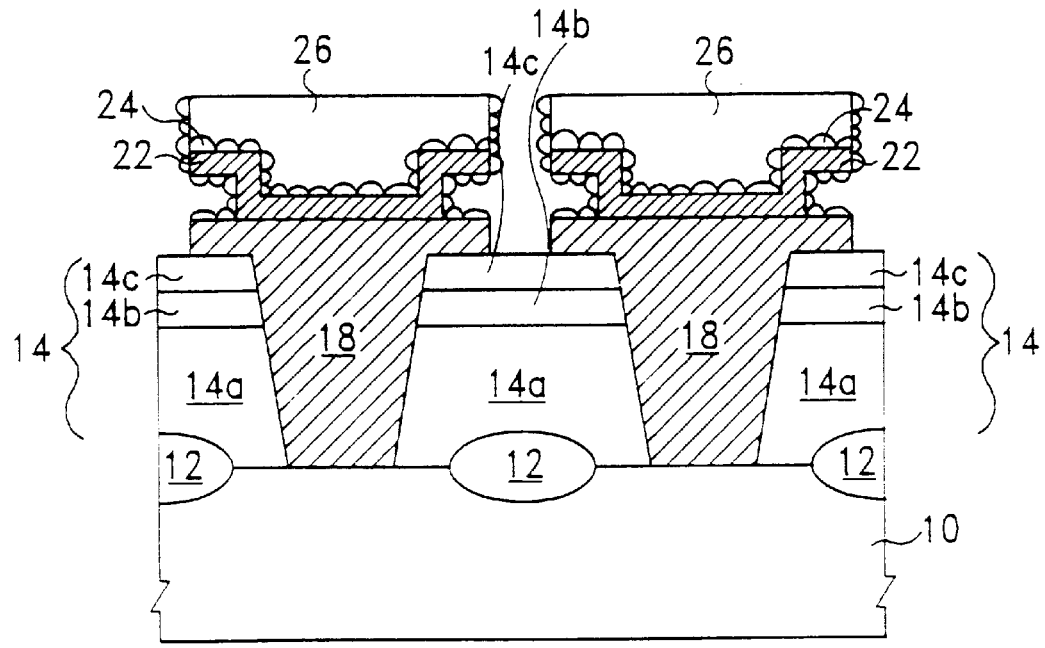
FIG. 8 is a cross sectional view of removing a portion of the second rugged silicon layer and a portion of the first conductive layer which are located outside the capacitor area in accordance with the present invention.

Turning to FIG. 8, a portion of the second rugged silicon layer 28 and a portion of the first conductive layer 18 which are located outside the capacitor area are removed. Thus the individual first electrodes of the capacitors can be isolated from each other. The first rugged silicon layer 24 is protected from any undesired etching-induced damage by the third dielectric layer 26 covering above. The second rugged silicon layer 28 on the bottom surface of the second conductive layer 22 is also masked from the etching damage. Thus the first electrodes can be formed with rugged silicon or HSG silicon surface which is free of damage and leakage problems.

Figure 9:
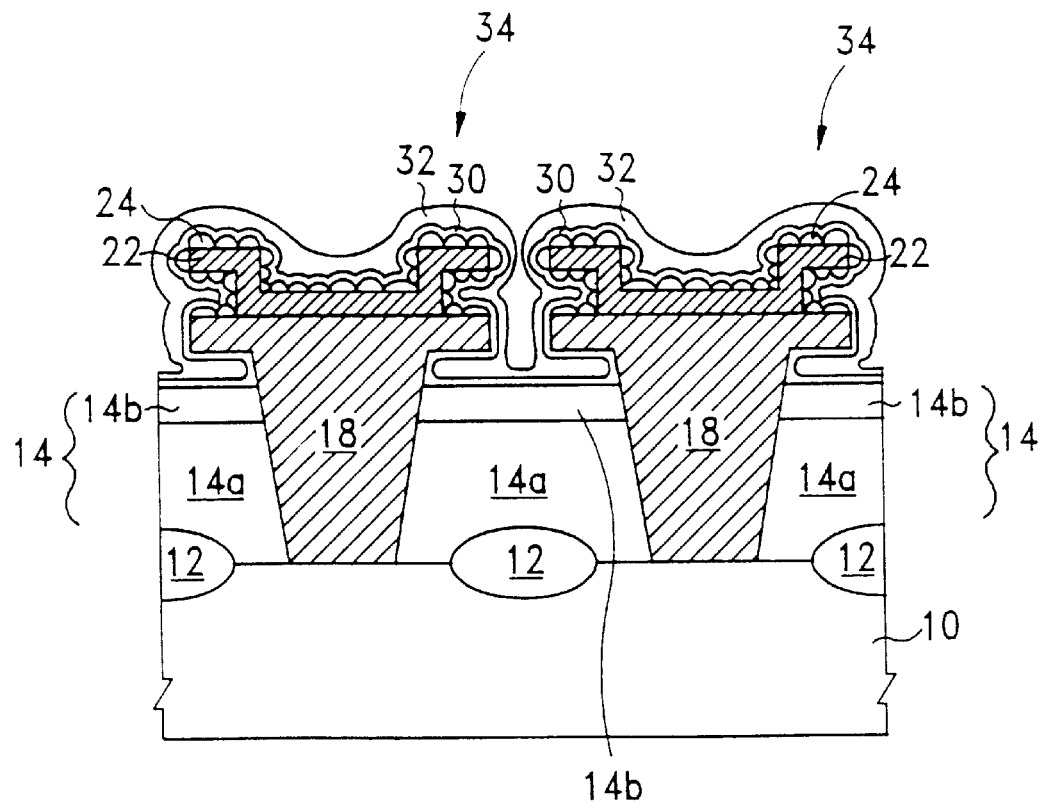
FIG. 9 is a cross sectional view of forming first electrodes, a fourth dielectric layer, and a second electrode layer in accordance with the present invention.

Next, the third dielectric layer 26 is removed to form the first electrodes 30, as shown in FIG. 9. The third dielectric layer 26 can be removed by a wet etching step. In the wet etching process, a portion of the first dielectric layer 14 like the oxide layer 14c is also removed as shown in the figure. Thus the isolated first electrodes are formed with more surface area to raise the capacitance of the capacitors.

For forming capacitors, two more steps can be added additionally. A fourth dielectric layer 30 is formed over the substrate 10. The fourth dielectric layer 30 can be an ONO (oxide-nitride-oxide) thin film with better dielectric characteristics. A second electrode layer 32 is then formed over the fourth dielectric layer 10. Thus the multiple capacitor structures 34 can be formed.

In addition, the above-identified process in forming inverse-π shape capacitors can be modified to form cylinder capacitors. The modified process as a second embodiment of the present invention can be as follows. Since the materials and detail steps in forming the cylinder capacitors are similar with the above illustrations, the details are not described.

Figure 10:
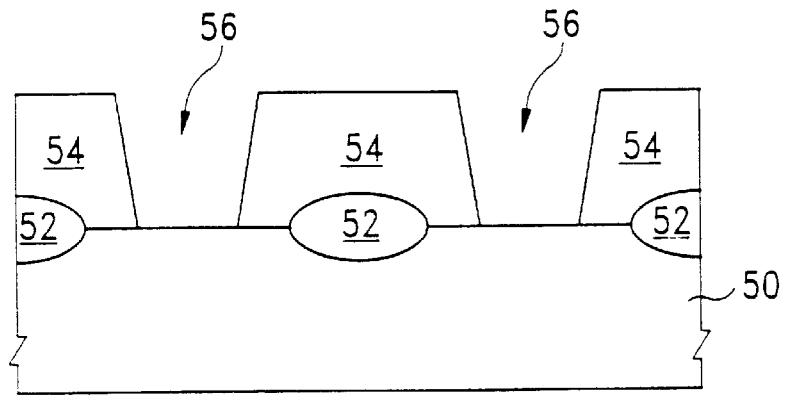
FIG. 10 is a cross sectional view of forming a first dielectric layer and defining contact holes in accordance with the present invention.
Figure 11:
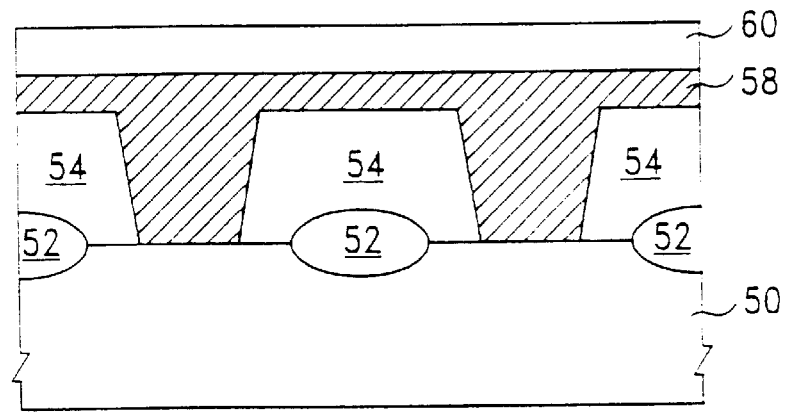
FIG. 11 is a cross sectional view of forming a first conductive layer and a second dielectric layer in accordance with the present invention.

Turning to FIG. 10, a similar semiconductor substrate 50 is illustrated. The elements like isolation regions 52 and transistors are formed over the substrate 50. At first, a first dielectric layer 54 is formed. A portion of the first dielectric layer 54 is then removed to define contact holes 56 within. Turning to FIG. 11, a first conductive layer 58 is formed within the contact holes 56 and over the first dielectric layer 54. A second dielectric layer 60 is then formed over the first conductive layer 58.

Figure 12:
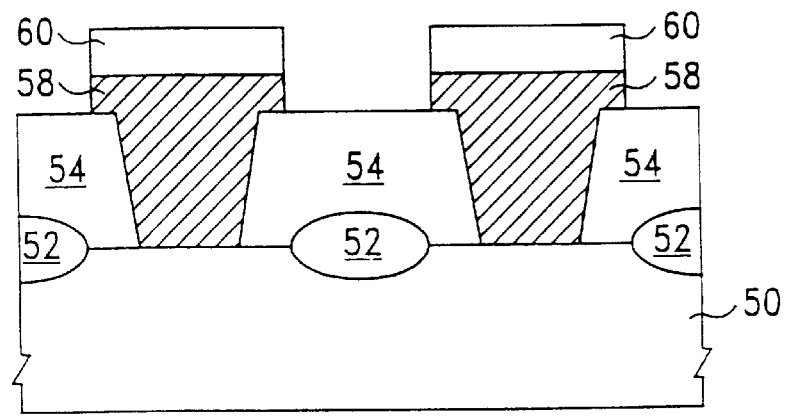
FIG. 12 is a cross sectional view of removing a portion of the second dielectric layer and of the first conductive layer to define a capacitor area in accordance with the present invention.
Figure 13:
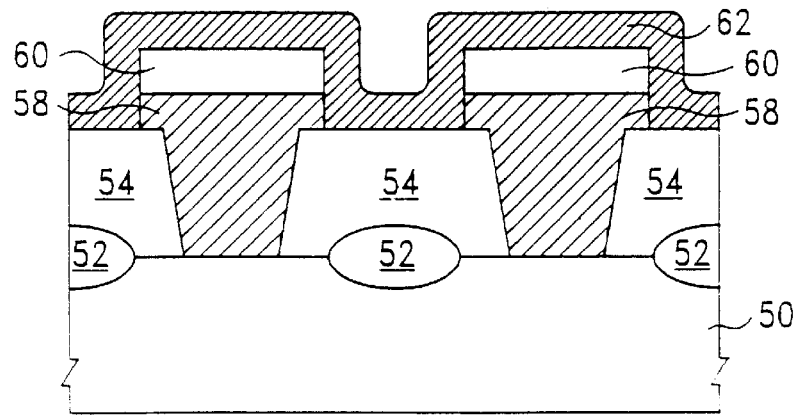
FIG. 13 is a cross sectional view of forming a second conductive layer over the substrate in accordance with the present invention.
Figure 14:
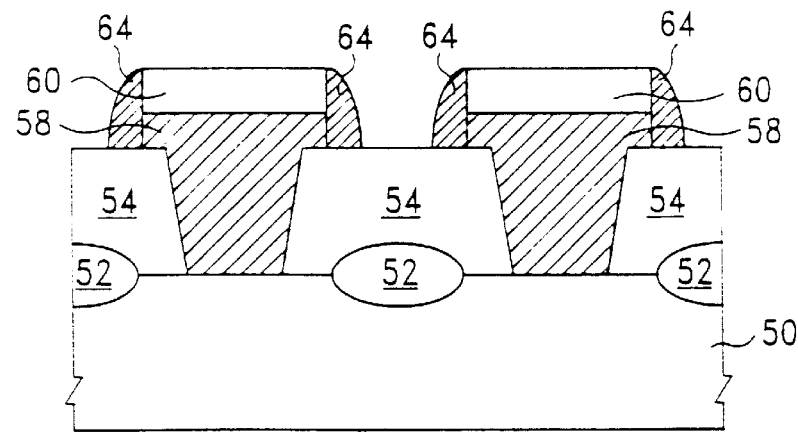
FIG. 14 is a cross sectional view of removing a portion of the second conductive layer to form a sidewall conductive structure in accordance with the present invention.
Figure 15:
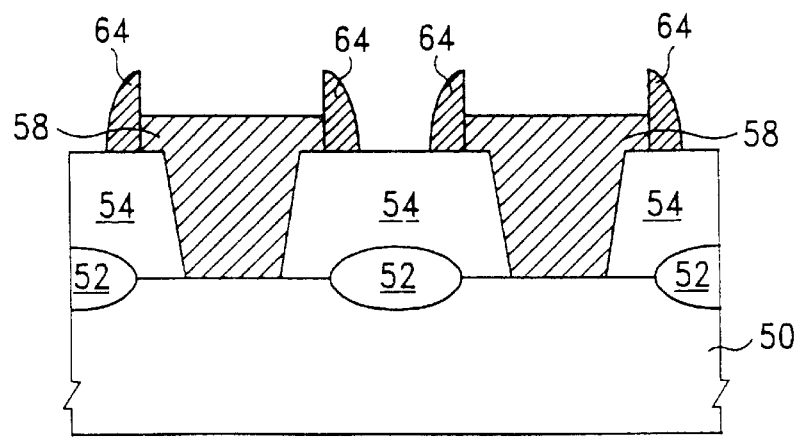
FIG. 15 is a cross sectional view of removing the second dielectric layer in accordance with the present invention.

Next, a portion of the second dielectric layer 60 and of first conductive layer 58 are removed to define the capacitor area, as shown in FIG. 12. For example, the capacitor area can be located approximately above the contact holes 56. Referring to FIG. 13, a second conductive layer 62 is then formed over the substrate 50. The second conductive layer 62 is formed on the second dielectric layer 60 and the first conductive layer 58. Turning to FIG. 14, a portion of the second conductive layer 62 is then removed to form a sidewall conductive structure 64 on the second dielectric layer 60 and the first conductive layer 58. The second dielectric layer 60 is then removed and a cylinder-like shape of the first electrode can be formed, as shown in FIG. 15.

Figure 16:
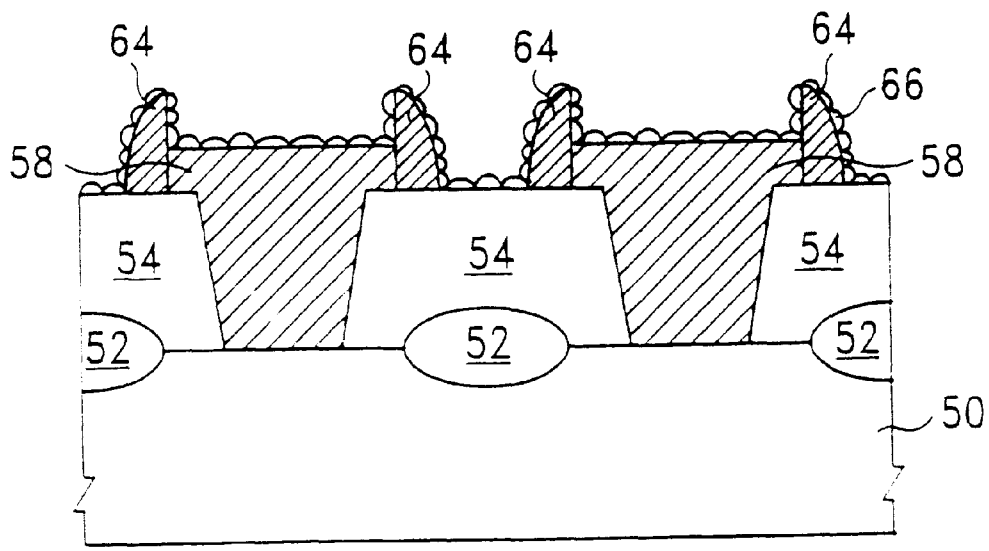
FIG. 16 is a cross sectional view of forming a rugged silicon layer over the substrate in accordance with the present invention.
Figure 17:
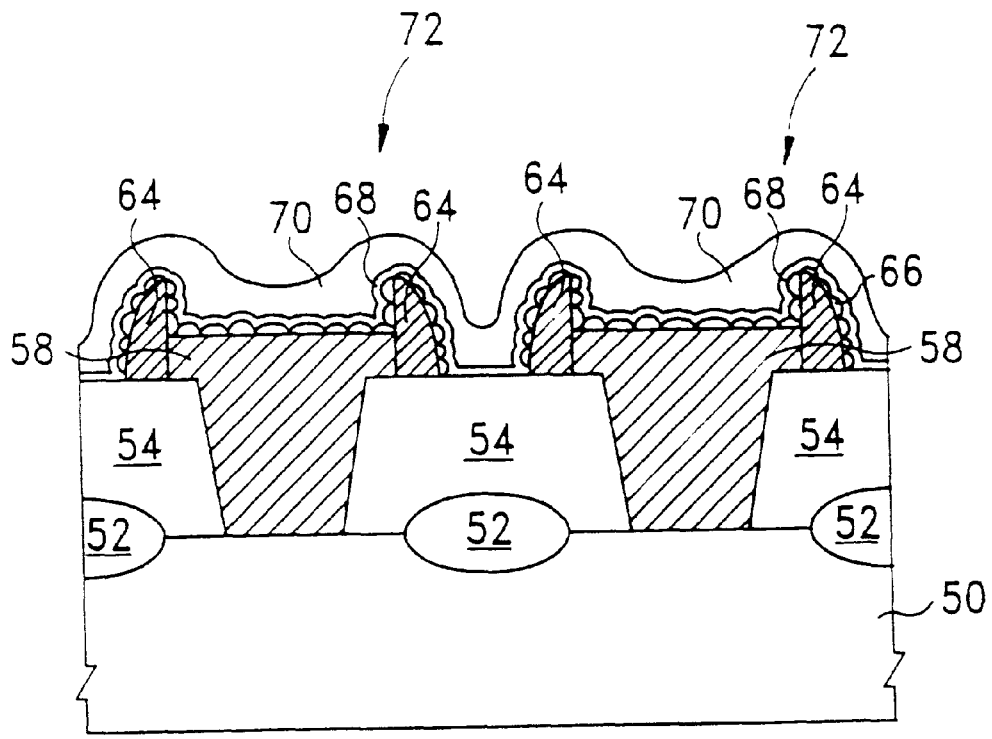
FIG. 17 is a cross sectional view of forming first electrodes, a third dielectric layer, and a second electrode layer in accordance with the present invention.

A rugged silicon layer 66 is then formed over the substrate 10, as shown in FIG. 16. Turning to FIG. 17, a portion of the rugged silicon layer 66 located on the first dielectric layer 54 is removed to form the first electrodes. In the same way, two more steps can be added additionally for forming capacitors. A third dielectric layer 68 is formed over the substrate 50. The third dielectric layer 68 can be an ONO (oxide-nitride-oxide) thin film with better dielectric characteristics. A second electrode layer 70 is then formed over the third dielectric layer 68. Thus the multiple capacitor structures 72 can be formed.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming first electrodes of capacitors on a semiconductor substrate, comprising the steps of:

forming a first dielectric layer on the substrate;

removing a portion of said first dielectric layer to define contact holes within;

forming a first conductive layer within said contact holes and over said first dielectric layer;

forming a second dielectric layer over said first conductive layer;

removing a portion of said second dielectric layer to define a shape of said first electrodes;

forming a second conductive layer over said second dielectric layer and said first conductive layer;

forming a first rugged silicon layer over said second conductive layer;

forming a third dielectric layer over said first rugged silicon layer;

removing a portion of said third dielectric layer, of said first rugged silicon layer, and of said second conductive layer to define a capacitor area;

removing said second dielectric layer;

forming a second rugged silicon layer over said substrate;

removing a portion of said second rugged silicon layer and a portion of said first conductive layer which are located outside said capacitor area; and removing said third dielectric layer to form said first electrodes.

2. The method of claim 1 further comprising the steps of forming a fourth dielectric layer over said substrate and of forming second electrodes over said fourth dielectric layer, which are performed after said step of removing said third dielectric layer, to form said capacitors.

3. The method of claim 1, wherein said first dielectric layer comprises a first oxide layer, a nitride layer over said first oxide layer, and a second oxide layer over said nitride layer.

4. The method of claim 1, wherein said first conductive layer comprises a polysilicon layer.

5. The method of claim 1, wherein said second dielectric layer comprises a BPSG layer.

6. The method of claim 1, wherein said second conductive layer comprises a polysilicon layer.

7. The method of claim 1, wherein said first rugged silicon layer comprises a HSG silicon film.

8. The method of claim 1, wherein said third dielectric layer comprises an oxide layer.

9. The method of claim 1, wherein said second rugged silicon layer comprises a HSG silicon film.

10. The method of claim 1, wherein said second rugged silicon layer is formed on a surface of said third dielectric layer, of said second conductive layer, and of said first conductive layer.

11. The method of claim 1, wherein a portion of said first dielectric layer is also removed in said step of removing said third dielectric layer.

* * * * *